United States Patent [19]

Nakajima

[11] Patent Number: 5,363,326

[45] Date of Patent: Nov. 8, 1994

[54] SEMICONDUCTOR MEMORY DEVICE HAVING CROSSED WORD LINES, AND METHOD OF OPERATING SAME

[75] Inventor: Hideharu Nakajima, Kanagawa, Japan

[73] Assignee: Sony Corporation, Tokyo, Japan

[21] Appl. No.: 3,595

[22] Filed: Jan. 13, 1993

[30] Foreign Application Priority Data

Feb. 4, 1992 [JP] Japan .................. 4-047985

[51] Int. Cl.⁵ .................. G11C 11/24; H01L 29/78
[52] U.S. Cl. .................. 365/149; 257/296; 257/306; 365/182
[58] Field of Search ............... 365/149, 182; 257/296, 257/306

[56] References Cited

U.S. PATENT DOCUMENTS

| | | | |
|---|---|---|---|
| 4,962,476 | 10/1990 | Kawada | 365/149 X |
| 4,970,564 | 11/1990 | Kimura | 257/306 |
| 5,025,294 | 6/1991 | Ema | 257/296 |
| 5,091,761 | 2/1992 | Hiraiwa | 257/306 |
| 5,194,753 | 3/1993 | Rhodes | 365/149 X |

FOREIGN PATENT DOCUMENTS

| | | | |
|---|---|---|---|
| 0317161 | 5/1989 | European Pat. Off. | 365/149 |
| 2219690 | 12/1989 | United Kingdom | 365/149 |

*Primary Examiner*—Eugene R. LaRoche
*Assistant Examiner*—Son Mai
*Attorney, Agent, or Firm*—Hill, Steadman & Simpson

[57] ABSTRACT

A main portion of a first word line extends in a direction connecting one diffusion region to the other diffusion region of an access transistor and is located between memory cells, and diverging portions of the first word line alternately extend from both sides of the main portion of the first word line to corresponding adjacent memory cells. A bit line extends in a direction perpendicular to the direction connecting one diffusion region to the other diffusion region, and a second word line extends along the diverging portion of the first word line. When stored data is to be read out from a memory cell, a positive voltage is applied to one first word line corresponding to the memory cell whose data is to be read out, and a zero voltage is applied to the remaining first word lines. Furthermore, a zero voltage is applied to one second word line corresponding to the memory cell whose data is to be read out, and a negative voltage which cancels the positive voltage applied to the first word line is applied to the remaining second word lines.

6 Claims, 4 Drawing Sheets

SEMICONDUCTOR MEMORY DEVICE HAVING CROSSED WORD LINES, AND METHOD OF OPERATING SAME

BACKGROUND OF THE INVENTION

1. Field of the Invention

The present invention relates to a semiconductor memory device called a DRAM and a method of operating the semiconductor memory device.

2. Description of the Prior Art

FIG. 1 shows a conventional stacked capacitor DRAM having a folded bit line arrangement. For the illustrative convenience, some of repetitive patterns are omitted in FIG. 1. In the DRAM, one memory cell is constituted by one access transistor 11 and one storage capacitor 12, and a word line WL1 serves as the gate electrode of the access transistor 11 in a memory cell X.

A storage node electrode 15 of the storage capacitor 12 is in contact with an n+-type diffusion region 13 serving as one of the source and drain of the access transistor 11 through a contact hole 14. A bit line BL2 is in contact with an n+-type diffusion region 16 serving as the other of the source and drain of the access transistor 11 through a contact hole 17 in the memory cell X.

In this prior art, as is apparent from FIG. 1, bit lines BL0, BL1, BL2, . . . extend in a direction connecting the diffusion regions 13 and 16, i.e., a y direction in FIG. 1, and word lines WL0, WL1, WL2, WL3, . . . extend in an x direction perpendicular to the y direction.

Since the memory device of the prior art has the folded bit line arrangement, portions of the word lines WL1 . . . located between the diffusion regions 13 and 16 and extending in the x direction are located on field insulation layers 21 between the memory cells adjacent to each other in the y direction. Therefore, the portions of the word lines WL1 . . . between the diffusion regions 13 and 16 serve as so-called select word line portions 22, and the portions of the word lines WL1 . . . on the field insulation layers 21 serve as so-called non-select word line portions 23.

When the two non-select word line portions 23 extend and are located between the memory cells adjacent to each other in the I direction as described above, not only the widths of the non-select word line portions 23 but the interval between the non-select word line portions 23 are required in the y direction. That is, since the lines and spaces of the non-select word line portions 23 are required in the Z direction, the sides of the memory cells cannot be easily decreased in length in the y direction.

In addition, since the bit lines BL2 . . . extend in the I direction, the bit lines BL2 . . . pass over the contact holes 14. For this reason, the storage capacitors 12 cannot be formed in the upper layer of the bit lines BL2 . . . , and the area of each of the storage capacitors 12 may be restricted with respect to the area of the corresponding memory cell. Due to the above reasons, in the prior art shown in FIG. 1, a memory cell area cannot be easily decreased, and a high integration level cannot be realized.

Note that an open bit line arrangement has no so-called non-select word line portion. However, in the folded bit line arrangement, stored data of a memory cell is output to only one of a pair of bit lines adjacent to each other, and no stored data is output to the other of the pair of bit lines. For this reason, the folded bit line arrangement has the following advantage and the like. That is, noise in a common mode is canceled by differentially operating a sense amplifier, and the sensitivity of the sense amplifier can be improved. However, the open bit line arrangement does not have the above advantages. Therefore, the open bit line arrangement cannot be employed.

SUMMARY OF THE INVENTION

According to the present invention, a semiconductor memory device comprises a plurality of memory cells arranged in an array of rows and columns, each memory cell having an access transistor and a storage capacitor which is connected one diffusion region of the access transistor; a bit line connected to the other diffusion region of the access transistor and extending in a second direction perpendicular to a first direction defined as the direction connecting said one diffusion region and the other diffusion region of said access transistor; a first word line having a main portion extending in said first direction, located between adjacent memory cells, and having diverging portions alternately extending from both sides of said main portion of the first word line to corresponding adjacent memory cells; and a second word line extending in said second direction and located along said diverging portion of the first word line.

With the above arrangement, a voltage for turning on an access transistor is applied to a first word line having a diverging portion in a memory cell to be selected, and a voltage which cancels an electric field so generated is applied to other second word lines adjacent to one second word line extending along the diverging portion. At this time, stored data of the memory cell is output to only the bit line connected to the memory cell to be selected, and the stored data of the memory cell is not output to the other bit line adjacent to the bit line connected to the memory cell to be selected. Therefore, a folded bit line arrangement can be formed by the above bit lines.

On the other hand, the first word lines extend in the first direction and are located between the memory cells, and only the diverging portions of the first word lines extend to the memory cells. For this reason, even in the folded bit line arrangement, lines and spaces for so-called non-select word line portions are not required between the memory cells adjacent to each other in the first direction.

In addition, since the bit lines extend in the second direction, the bit line does not pass over the connection between one of the source and drain of each of the access transistors and each of the storage capacitors. For this reason, the capacitors can be formed in not only the upper layer of the first and second word lines but the upper layer of the bit lines.

The connection between one of the source and drain of each of the access transistors and each of the storage capacitors is surrounded by a corresponding one of the main portions of the first word lines, a corresponding one of the second word lines, a corresponding one of the diverging portions of the first word lines and a corresponding one of the bit lines. For this reason, although controlled etching must be performed under the limited etching conditions when one side of the connection is along a field insulation layer, the connection surrounded as described above does not require the controlled etching, and a self-aligned contact hole is easily formed in the connection.

That is, in the semiconductor memory device according to the present invention, although a folded bit line arrangement can be formed, lines and spaces for so-called non-select word line portions are not required between the memory cells adjacent to each other in the first direction connecting one of the source and drain of an access transistor to the other of the source and drain of the access transistor. For this reason, the side of each of the memory cells can be considerably decreased in length in the first direction.

In addition, since storage capacitors can be formed in not only the upper layer of the first and second word lines but the upper layer of the bit lines, a capacitor area occupied in a memory cell area can be increased. Therefore, the memory cell area can be decreased, and a high integration level can be realized.

Since a self-aligned contact hole can be easily formed in the connection between one of the source and drain of each of the access transistors and each of the storage capacitors, simple manufacturing processes can be obtained.

DETAILED DESCRIPTION OF THE PREFERRED EMBODIMENT

Figure 1:
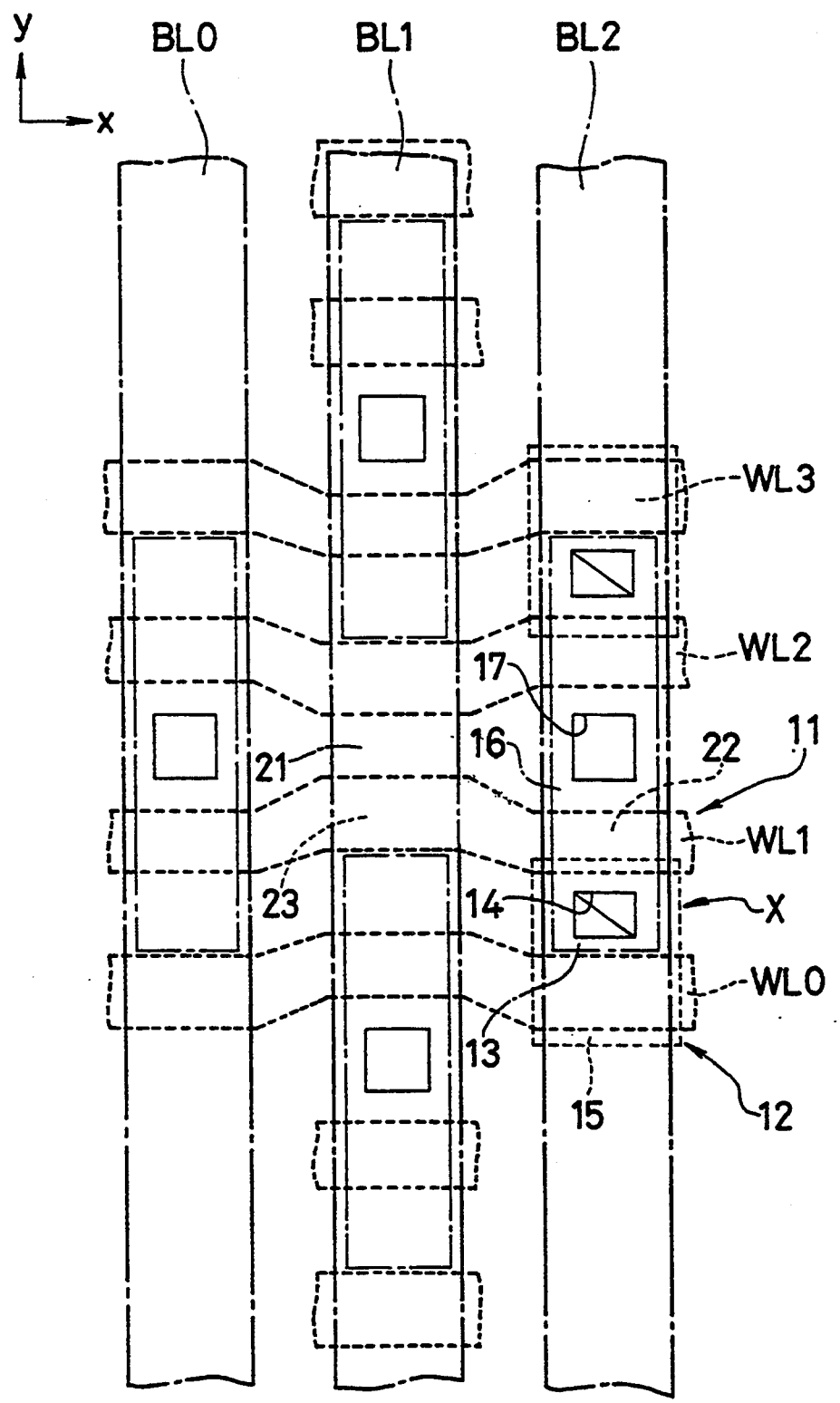
FIG. 1 is plan view showing a prior art.

An embodiment of the present invention applied to a stacked capacitor DRAM having a folded bit line arrangement will be described below with reference to FIGS. 2 to 4. The same reference numerals as in the prior art shown in FIG. 1 denote the same constituent parts in FIGS. 2 to 4. For the illustrative convenience, some of repetitive patterns are omitted in FIG. 2.

Figure 2:
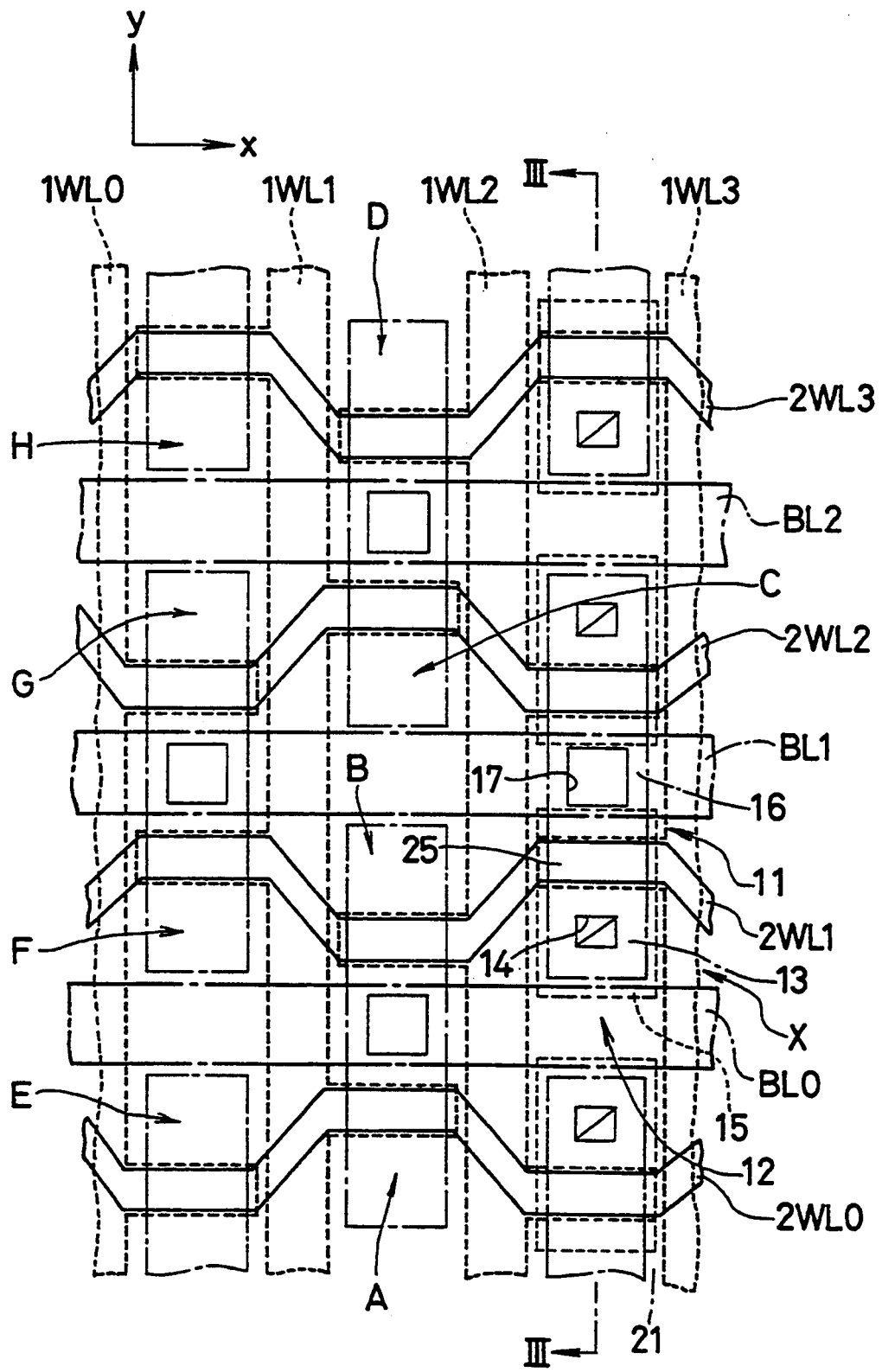
FIG. 2 is a plan view showing a semiconductor memory device according to an embodiment of the present invent ion.
Figure 3:
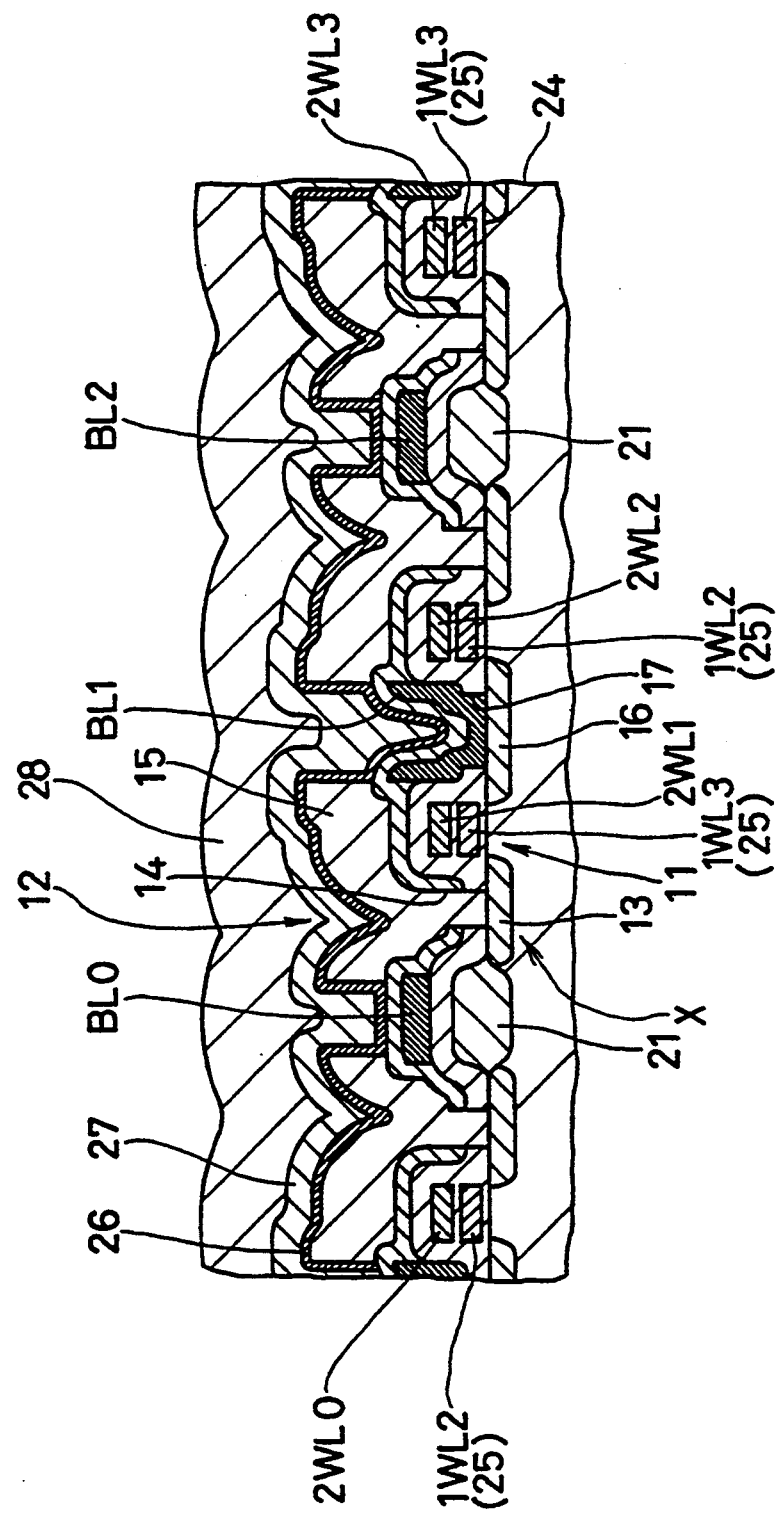
FIG. 3 is a sectional side view showing the semiconductor memory device along a line III—III in FIG. 2.

In this embodiment, as shown in FIGS. 2 and 3, first word lines 1WL0, 1WL1, 1WL2, 2WL3, . . . are formed by a first conductive layer on a semiconductor substrate 24. These first word lines 1WL0, 1WL1 . . . are located on field insulation layers 21 between memory cells adjacent to each other in an x direction perpendicular to a y direction connecting diffusion regions 13 and 16 in FIG. 2 and extend in the y direction.

Each of the first word lines 1WL1 . . . has diverging portions 25 alternately extending from both sides of a corresponding one of the first word lines to corresponding adjacent memory cells and located between the diffusion regions 13 and 16 in the x direction, and these diverging portions 25 are used as the gate electrodes of access transistors 11 in the memory cells.

Second word lines 2WL0, 2WL1, 2WL2, 2WL3, . . . extending and located on the diverging portions 25 slightly windingly arranged in the x direction are formed by a second conductive layer on the semiconductor substrate 24.

Bit lines BL0, BL1, BL2, . . . are formed by a third conductive layer on the semiconductor substrate 24 and extend in the x direction. These bit lines BL1 . . . are in contact with the diffusion regions 16 through contact holes 17.

Storage node electrodes 15 of storage capacitors 12 are formed by a fourth conductive layer on the semiconductor substrate 24, and are in contact with the diffusion regions 13 through the contact holes 14. A capacitor dielectric film 26 is formed on the storage node electrodes 15, and a plate electrode 27 for the storage capacitors 12 is formed by a fifth conductive layer on the semiconductor substrate 24. An overcoat film 28 is formed on the plate electrode 27, thereby completing the semiconductor memory device of this embodiment.

In the above DRAM according to the embodiment, in order to read stored data from, e.g., a memory cell A, the voltage of the first word line 1WL1 having the diverging portion 25 on the memory cell A is set to be 5 V, and the voltage of each of all the remaining first word lines 1WL0, 1WL2, 1WL3, . . . is set to be 0 V.

At the same time, the voltage of every other second word line including the second word line 2WL0 extending along the diverging portion 25 of the memory cell A, i.e., the voltage of each of the second word lines 2WL0, 2WL2, . . . is set to be 0 V, and the voltage of each of all the remaining second word lines 2WL1, 2WL3, . . . is set to be −5 V.

Only when the voltage of the first word line 1WL1 is set to be 5 V, and. the voltage of each of all the remaining first word lines 1WL0, 1WL2, 1WL3, . . . is set to be 0 V, stored data of all the memory cells A, F, C, H, . . . on which the diverging portions 25 of the first word line 1WL1 are respectively located are output to the bit lines BL0, BL1, BL2, . . . , respectively.

For this reason, in this case, when stored data of the memory cell is read out from the voltage of the other of a pair of bit lines connected to a sense amplifier with respect to the voltage of one of the pair of bit lines, a folded bit line arrangement using adjacent bit lines as bit lines for applying a reference voltage cannot be formed.

In contrast to this, according to this embodiment, the voltages of the second word lines 2WL0, 2WL1, 2WL2, 2WL3, . . . are set to be the above voltages, the access transistors 11 are turned on in the memory cells A, C, . . . in each of which a corresponding one of the diverging portions 25 of the first word line 1WL1 having the voltage of 5 V is stacked with a corresponding one of the second word lines 2WL0, 2WL2 . . . each having the voltage of 0 V. The stored data of the memory cells A, C . . . are output to the bit lines BL0, BL2, . . . , respectively.

However, in the memory cells F, H, . . . in each of which a corresponding one of the diverging portions 25 of the first word line 1WL1 having the voltage of 5 V is stacked with a corresponding one of the second word lines 2WL1, 2WL3, . . . each having the voltage of −5 V, the electric fields of the first and second word lines 1WL1, 2WL1, 2WL3, . . . are canceled each other, and the voltage of each of the gate electrodes is equivalent to 0 V. For this reason, the access transistors 11 in the memory cells F, H, . . . are not turned on, and the stored data of the memory cells F, H, . . . are not output to the bit lines BL1, . . . .

In the memory cells E, G, . . . in each of which a corresponding one of the diverging portions 25 of the first word lines 1WL0, 1WL2, 1WL3, . . . each having the voltage of 0 V is stacked with a corresponding one of the second word lines 2WL0, 2WL2, . . . , the access transistors 11 are not turned on, as a matter of course, and stored data of the memory cells E, G, . . . are not output to the bit lines BL1 . . . .

In addition, in the memory cells B, D, . . . in each of which a corresponding one of the diverging portions 25 of the first word lines 1WL0, 1WL2, 1WL3, . . . each having the voltage of 0 V is stacked with a corresponding one of the second word lines 2WL1, 2WL3, . . . each having the voltage of −5 V, the channel regions of the access transistors 11 are switched to an accumulation state. For this reason, the access transistors 11 are not turned on, and stored data of the memory cells B, D, . . . are not output to the bit line BL1 . . . .

As a result, only the stored data in the memory cells A, C, . . . are output to the bit lines BL0, BL2, . . . , respectively. For this reason, according to this embodiment, a folded bit line arrangement can be formed by using the pair of bit lines BL0, BL1, . . . adjacent to each other.

In the above embodiment, the stored data of the memory cells A, C, . . . of the memory cells A, F, C, H, . . . using, as gate electrodes, the diverging portions 25 of the first word line 1WL1 having the voltage of 5 V are output to the bit lines BL0, BL2, . . . , respectively. In contrast to the above embodiment, when the voltage of each of the second word lines 2WL0, 2WL2, . . . is set to be −5 V, and the voltage of each of all the remaining second word lines 2WL1, 2WL3, . . . is set to be 0 V, the stored data of the memory cells F, H . . . can be output to the bit lines BL1 . . . , respectively.

Figure 4A:
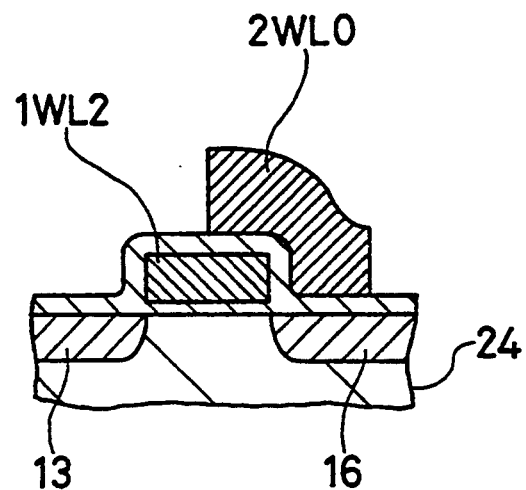
FIGS. 4A and 4B are sectional side views showing the main parts of modifications of the embodiment of the present invention, respectively.
Figure 4B:
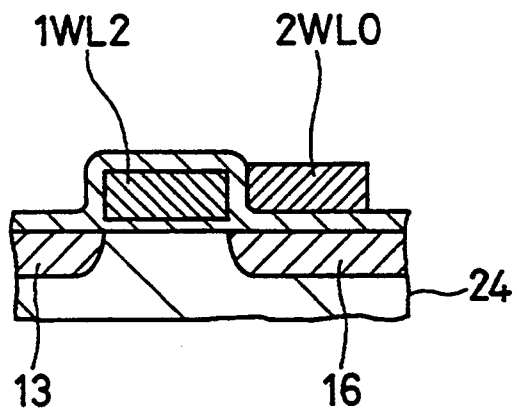

FIGS. 4A and 4B show modifications of the above embodiment. In the embodiment shown in FIGS. 2 and 3, the second word lines 2WL0, 2WL1, 2WL2, 2WL3, . . . are completely stacked on the diverging portions 25 of the first word lines 1WL0, 1WL1, 1WL2, 1WL3, . . . However, as shown in FIG. 4A, the second word lines 2WL0, 2WL1, 2WL2, 2WL3 . . . may be partially stacked on the diverging portions 25 of the first word lines 1WL0, 1WL1, 1WL2, 1WL3, . . . , and as shown in FIG. 4B, the second word lines 2WL0, 2WL1, 2WL2, 2WL3, . . . need not be stacked on the diverging portions 25 of the first word lines 1WL0, 1WL1, 1WL2, 1WL3, . . . In short, the second word lines 2WL0, 2WL1, 2WL2, 2WL3, . . . have only to extend along the diverging portions 25 of the first word lines 1WL0, 1WL1, 1WL2, 1WL3, . . . to be able to cancel electric fields of the diverging portions 25.

What is claimed is:

1. A semiconductor device comprising:
   a plurality of memory cells arranged in an array of rows and columns, each memory cell having an access transistor and a storage capacitor which is connected to one diffusion region of the access transistor;
   a bit line connected to the other diffusion region of the access transistor and extending in a second direction perpendicular to a first direction defined as the direction connecting said one diffusion region and the other diffusion region of said access transistor;
   a first word line having a main portion extending in said first direction, located between adjacent memory cells, and having diverging portions alternately extending from both sides of said main portion of the first word line to corresponding adjacent memory cells; and
   a second word line extending in said second direction and located along said diverging portion of the first word line.

2. A semiconductor memory device according to claim 1, wherein said second word line is formed on an insulation layer which is formed on said diverging portion of the first word line.

3. A semiconductor memory device according to claim 1, wherein said second word line is formed on an insulation layer which is formed on said diverging portion of the first word line and on an insulation layer which is formed on the surface of said one diffusion region of the access transistor.

4. A semiconductor memory device according to claim 1, wherein said second word line is formed on an insulation layer which is formed on the surface of said one diffusion region of the access transistor and is adjacent to said diverging portion of the first word line.

5. A semiconductor memory device according to claim 1, wherein the connection between said storage capacitor and said one diffusion region of the access transistor is formed in the region which is surrounded by said main portion of the first word line, said diverging portion of the first word line, said second word line and said bit line.

6. A method of operating a semiconductor device containing a plurality of memory cells each having an access transistor and a storage capacitor which is connected to one diffusion region of the access transistor, a plurality of bit lines connected to the other diffusion region of the access transistor, a plurality of first word lines each having a main portion and diverging portions, and a plurality of second word lines located along diverging portions of the first word line, comprising:
   applying a positive voltage to a first word line corresponding to the memory cell whose stored signal is read out;
   applying a zero voltage to other first word lines;
   applying a zero voltage to second word lines corresponding to said memory cell whose stored signal is read out;
   applying a negative voltage to other second word lines, thereby canceling the positive voltage applied to the first word line corresponding to the memory cell whose stored signal is read out; and
   outputting the stored signal from the bit lines corresponding to the memory cell whose stored signal is read out.

* * * * *